US008531237B2

(12) United States Patent
Aisu

(10) Patent No.: US 8,531,237 B2

(45) Date of Patent: Sep. 10, 2013

(54) LOW-PASS FILTER, CONSTANT VOLTAGE CIRCUIT, AND SEMICONDUCTOR INTEGRATED CIRCUIT INCLUDING SAME

(75) Inventor: Katsuhiko Aisu, Takaraduka (JP)

(73) Assignee: Ricoh Company, Ltd., Tokyo (JP)

( * ) Notice: Subject to any disclaimer, the term of this patent is extended or adjusted under 35 U.S.C. 154(b) by 443 days.

(21) Appl. No.: 12/835,175

(22) Filed: Jul. 13, 2010

(65) Prior Publication Data

US 2011/0012582 A1 Jan. 20, 2011

(30) Foreign Application Priority Data

Jul. 14, 2009 (JP) ................................ 2009-165466

(51) Int. Cl.
*H03H 11/04* (2006.01)

(52) U.S. Cl.
USPC ............................ 327/558; 323/273; 323/316

(58) Field of Classification Search
USPC .......... 323/313, 314, 315, 316, 317; 327/558
See application file for complete search history.

(56) References Cited

U.S. PATENT DOCUMENTS

| | | | | |
|---|---|---|---|---|
| 4,368,440 | A * | 1/1983 | Darrow | 333/172 |
| 4,868,482 | A * | 9/1989 | O'Shaughnessy et al. | 323/313 |
| 5,999,043 | A | 12/1999 | Zhang et al. | |
| 6,426,612 | B1 * | 7/2002 | Rozsypal | 323/282 |
| 7,397,226 | B1 | 7/2008 | Mannama et al. | |
| 7,746,046 | B2 * | 6/2010 | Chen | 323/270 |

FOREIGN PATENT DOCUMENTS

| | | |
|---|---|---|
| JP | 5-127761 | 5/1993 |

* cited by examiner

*Primary Examiner* — Gary L Laxton
*Assistant Examiner* — Alex Torres-Rivera
(74) *Attorney, Agent, or Firm* — Cooper & Dunham LLP

(57) ABSTRACT

A low-pass filter that filters an input signal input to a filter input terminal to output a filtered output signal to a filter output terminal includes a capacitor, a first field-effect transistor, a first resistor, and a first current source. The capacitor is connected between the filter output terminal and ground. The first field-effect transistor has a gate terminal, a first conduction terminal connected to the filter input terminal, and a second conduction terminal connected to the filter output terminal. The first resistor is connected between the gate and first conduction terminals of the first transistor. The first current source is connected to the first resistor to supply a first current to the first resistor. The first resistor generates a first voltage thereacross based on the supplied first current for electrically biasing the gate terminal of the first transistor.

13 Claims, 7 Drawing Sheets

LOW-PASS FILTER, CONSTANT VOLTAGE CIRCUIT, AND SEMICONDUCTOR INTEGRATED CIRCUIT INCLUDING SAME

CROSS-REFERENCE TO RELATED APPLICATION

This application claims priority under 35 U.S.C. §119 to Japanese Patent Application No. 2009-165466 filed on Jul. 14, 2009 with the Japanese Patent Office.

BACKGROUND OF THE INVENTION

1. Technical Field

The present invention relates to a low-pass filter, a constant voltage circuit, and a semiconductor integrated circuit including the same, and more particularly, to a low-pass filter and a constant voltage circuit for use in ultra-low noise constant voltage regulation which can be integrally formed on a single semiconductor substrate, and a semiconductor integrated circuit including such a voltage regulator with a low-pass filter incorporated therein.

2. Discussion of the Background

Electronic low-pass filters are used in various semiconductor circuits which eliminate high frequencies above a given cutoff frequency to provide accurate signals free from high-frequency noise. One typical application is in voltage regulation, where a low-pass filter is connected between a reference voltage generator output terminal and a regulator output terminal to filter out flicker or 1/f noise inherent in the semiconductor device from a reference voltage based on which an output voltage is regulated.

FIG. 1 is a circuit diagram schematically illustrating a constant voltage circuit 100 employing a conventional, resistance-capacitance low-pass filter 110 consisting of a resistor R111 and a capacitor C111 connected in series.

As shown in FIG. 1, the constant voltage circuit 100 is a series regulator that regulates an input voltage Vin input to an input terminal IN to output a constant output voltage Vout to an output terminal OUT, including a bipolar, output transistor M111 connected between the input and output terminals IN and OUT, a resistor R112 and a Zener diode ZD connected in series between the input terminal IN and ground to form a reference node Nref therebetween, and an error amplifier 111 with a non-inverting input connected to the node Nref through the RC low-pass filter 110, an inverting input connected to the output terminal OUT, and an output connected to a base terminal of the output transistor M111.

During operation, the Zener diode ZD generates a reference voltage Vref at the reference node Nref for input to the non-inverting input of the error amplifier 111, which compares the reference voltage Vref against the output voltage Vout input to its inverting input to output a regulator control signal that controls the base current of the output transistor M111 so as to maintain the output voltage Vout equal to the reference voltage Vref.

Interposed between the reference node Nref and the non-inverting input of the error amplifier 111, the low-pass filter 110 has the series circuit of the resistor R111 and the capacitor C111 connected across the node Nref and ground. The resistor R111 and the capacitor C111 are provided with particular resistance and capacitance scaled to yield an appropriate cutoff frequency rated in the range of below one to several hertz (Hz) depending on specific requirements of the voltage regulator. For example, a cutoff frequency of approximately 1 Hz, which is required for proper filtering of 1/f noise, can be obtained in the low-pass filter 110 with the resistor R111 having a value of 1 megaohms (MΩ) and the capacitor C111 having a value of 1 microfarad (μF).

The conventional low-pass filter 110 is not practical where the cutoff frequency desired is very low. This is because, in practice, all the components of the filtering circuit are constructed on a single semiconductor substrate for integration into a monolithic IC, which imposes limits on the physical sizes and therefore the values of both the resistor and the capacitor in use.

For example, consider a case where the capacitor C111 has its value limited to below 100 picofarads (pF). With such a small capacitance, obtaining a cutoff frequency of 1 Hz requires a resistance of 10 gigaohms (GΩ) or higher of the resistor R111, which is technically difficult to form on a single semiconductor substrate on which the capacitor C111 is disposed. Thus, the conventional low-pass filter 110 is implemented with at least one of the resistor R111 and the capacitor C111 built as a discrete component external from the integrated circuit, making the implementation less successful than desired.

The problem of the conventional low-pass filter 110 may be overcome by replacing the resistor R111 with a transistor operated with no gate bias voltage applied thereto. Compared to a simple resistor, a zero-biased transistor provides an extremely high impedance relative to its size, allowing for obtaining a low cutoff frequency with a reasonably small capacitance without requiring large space in the semiconductor circuit.

FIG. 2 is a circuit diagram schematically illustrating a constant voltage circuit 200 employing a low-pass filter 210 consisting of a zero-biased transistor M211 and a capacitor C211 connected in series.

As shown in FIG. 2, the constant voltage circuit 200 is a series regulator that regulates an input voltage Vin input to an input terminal IN to output a constant output voltage Vout to an output terminal OUT, including a p-channel metal-oxide semiconductor (PMOS) transistor M201 connected between the input and output terminals IN and OUT, a reference voltage generator 221, and a reference voltage amplification circuit formed of an operational amplifier 212 with an inverting input connected to a node between a pair of resistors R213 and R214 connected in series, a non-inverting input connected to the reference voltage generator 221, and an output connected to its non-inverting input through the resistor R213 to form an amplified reference node Nref, as well as a buffer amplifier 211 with a non-inverting input connected to the node Nref through the low-pass filter 210, a non-inverting input connected to the output terminal OUT, and an output connected to a gate terminal of the output transistor M201.

During operation, the reference voltage generator 221 generates a reference voltage Vref for input to the reference amplification circuit, which then generates an amplified reference voltage at the reference node Nref for input to the inverting input of the buffer amplifier 211. The buffer amplifier 211 compares the amplified reference voltage against the output voltage Vout input to its non-inverting input to generate a regulator control signal that controls the operation of the output transistor M201 so as to maintain the output voltage Vout equal to the amplified reference voltage.

Interposed between the amplified reference node Nref and the input of the buffer amplifier 211, the low-pass filter 210 has the zero-biased transistor R211 and the capacitor C211 connected in series across the node Nref and ground. The transistor M211 is a PMOS transistor with its gate and source terminals connected together to exhibit an extremely high impedance, higher than that obtained with a simple resistor. Using the zero-biased transistor M211 as an impedance allows for implementing the low-pass filter 210 on a single integrated circuit, with a sufficiently low cutoff frequency even where the capacitor C211 is of a small value.

Although effective in providing a low cutoff frequency with a relatively small circuit, the low-pass filter 210 depicted above has a drawback. That is, variations in the cutoff frequency can occur due to variations in the impedance of the zero-biased transistor M211, which has variations in physical properties from one transistor to the next caused by manufacturing process inconsistencies or environmental changes that are difficult to control and eliminate completely, resulting in reduced accuracy and stability of the low-pass filter 210. To address this problem, several methods have been proposed to stabilize the impedance of the biased transistor in the low-pass filter 210.

FIG. 3 is a circuit diagram of another conventional low-pass filter 210*a* for use in the constant voltage circuit 200, shown with an input terminal LPIN for connection with the reference node Nref and an output terminal LPOUT for connection with the error amplifier input.

As shown in FIG. 3, the low-pass filter 210*a* has the series circuit of the PMOS transistor M211 and the capacitor C211 arranged with an additional, PMOS transistor M212 and a current source I211 connected in series between the input terminal LPIN and ground. The two PMOS transistors M211 and M212 have their source terminals connected together and their gate terminals connected together and to the drain of the transistor M212 which is connected to the current source I211. With the transistors M211 and M212 thus forming a current mirror, the transistor M211 conducts an amount of current proportional to a current i211 supplied to the transistor M212 from the current source I211.

In such a configuration, varying the amount of current i211 allows adjustment of the impedance of the biased transistor M211 to a desired value lower than that obtained with no bias voltage applied to the transistor. The ability to adjust the transistor impedance enables the low-pass filter 210*a* to operate with a desired cutoff frequency regardless of manufacturing process inconsistencies and environmental changes.

FIG. 4 is a circuit diagram illustrating still another conventional low-pass filter 210*b* for use in the constant voltage circuit 200.

As shown in FIG. 4, the low-pass filter 210*b* includes, in addition to the capacitor C211, the PMOS transistors M211 and M212, and the current source I211, another current mirror formed of a pair of n-channel metal-oxide semiconductor (NMOS) transistors M213 and M214 inserted between the current source I211 and the current mirror of the transistors M211 and M212. The NMOS transistor M214 is sized twenty-five times larger than the NMOS transistor M213, and the PMOS transistor M212 approximately nine hundred sixty times larger than the PMOS transistor M211, so that the amount of current supplied to the transistor M211 through the two current mirrors is approximately 1/24,000 times smaller than the current i211 supplied from the current source I211.

In addition to being capable of adjusting the impedance of the biased transistor M211, provision of the dual-current mirror circuit allows the low-pass filter 210*b* to precisely adjust the current through the transistor M211 relative to the supplied current i211, compared to the circuit depicted in FIG. 3 which requires precise control of an extremely small and consistent current i211 supplied from the current source I211 to obtain a sufficiently high impedance of the transistor M211.

Although obtaining higher accuracy and stability of the transistor impedance compared to those depicted in FIGS. 2 and 3, even the improved circuit 210*b* is still susceptible to variations where the current source I211 itself has variations resulting from manufacturing process inconsistencies or environmental changes. Variations in the supplied current i211 affect the gate bias voltage of the transistor M212 that is the gate bias voltage of the transistor M211, resulting in significant variations in the impedance of the transistor M211 and concomitant variations in the cutoff frequency of the low-pass filter 210*b*.

BRIEF SUMMARY

This disclosure describes an improved low-pass filter that filters an input signal input to a filter input terminal to output a filtered output signal to a filter output terminal.

In one aspect of the disclosure, the improved low-pass filter includes a capacitor, a first field-effect transistor, a first resistor, and a first current source. The capacitor is connected between the filter output terminal and ground. The first field-effect transistor has a gate terminal, a first conduction terminal connected to the filter input terminal, and a second conduction terminal connected to the filter output terminal. The first resistor is connected between the gate and first conduction terminals of the first transistor. The first current source is connected to the first resistor to supply a first current to the first resistor. The first resistor generates a first voltage thereacross based on the supplied first current for electrically biasing the gate terminal of the first transistor.

This disclosure also describes an improved constant voltage circuit that converts an input voltage input to a voltage input terminal to generate a constant output voltage output to a voltage output terminal.

In one aspect of the disclosure, the constant voltage circuit includes an output transistor, a reference voltage generator, a regulator control circuit, and a low-pass filter. The output transistor is connected between the voltage input and output terminals to control current flow therethrough according to a regulator control signal applied to a control terminal thereof. The reference voltage generator generates a reference voltage. The regulator control circuit is connected to the reference voltage generator and the voltage output terminal to generate the regulator control signal based on a comparison of the output voltage and the reference voltage for application to the control terminal of the output transistor. The low-pass filter has a filter input terminal connected to the reference voltage generator and a filter output terminal connected to the control circuit to filter the reference voltage input to the filter input terminal to output a filtered reference voltage to the filter output terminal. The low-pass filter includes a capacitor, a first field-effect transistor, a first resistor, and a first current source. The capacitor is connected between the filter output terminal and ground. The first field-effect transistor has a gate terminal, a first conduction terminal connected to the filter input terminal, and a second conduction terminal connected to the filter output terminal. The first resistor is connected between the gate and first conduction terminals of the first transistor. The first current source is connected to the first resistor to supply a first current to the first resistor. The first resistor generates a first voltage thereacross based on the supplied first current for electrically biasing the gate terminal of the first transistor.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF EXEMPLARY EMBODIMENTS

Figure 1:
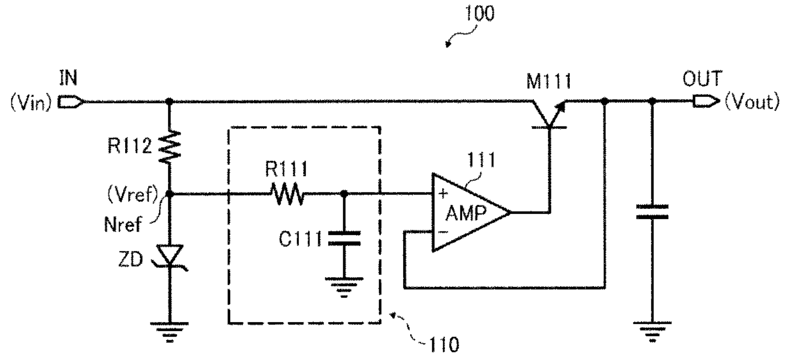
FIG. 1 BACKGROUND ART
FIG. 1 is a circuit diagram schematically illustrating a constant voltage circuit employing a conventional low-pass filter.
Figure 2:
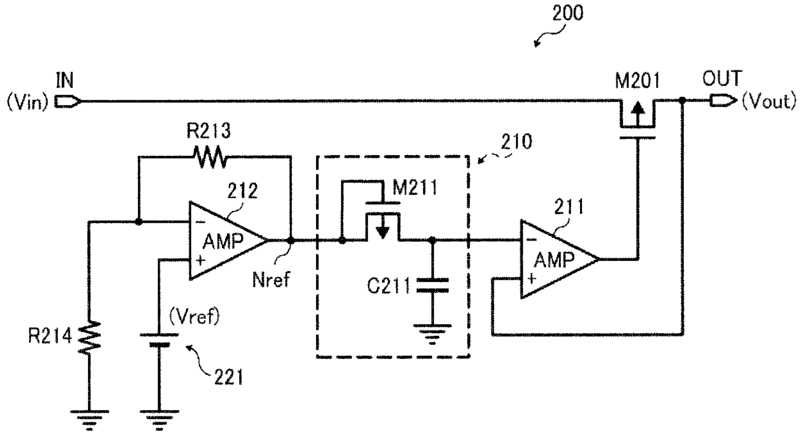
FIG. 2 BACKGROUND ART
FIG. 2 is a circuit diagram schematically illustrating a constant voltage circuit employing another conventional low-pass filter.
Figure 3:
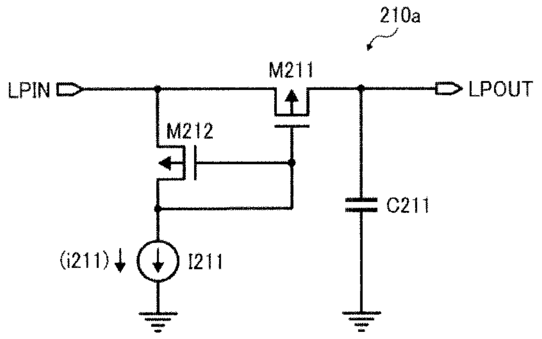
FIG. 3 BACKGROUND ART
FIG. 3 is a circuit diagram illustrating an arrangement of the conventional low-pass filter of FIG. 2.
Figure 4:
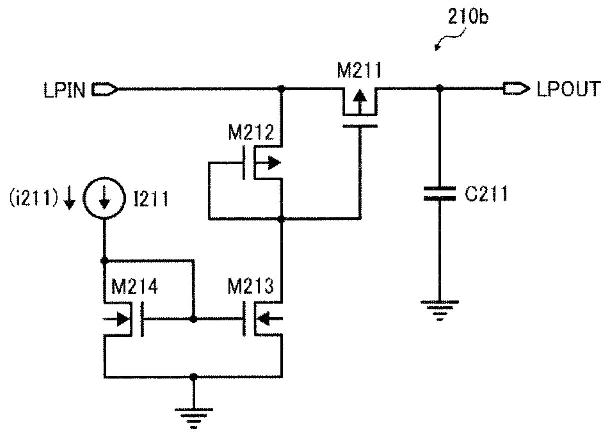
FIG. 4 BACKGROUND ART
FIG. 4 is a circuit diagram illustrating another arrangement of the conventional low-pass filter of FIG. 2.

In describing exemplary embodiments illustrated in the drawings, specific terminology is employed for the sake of clarity. However, the disclosure of this patent specification is not intended to be limited to the specific terminology so selected, and it is to be understood that each specific element includes all technical equivalents that operate in a similar manner and achieve a similar result.

Referring now to the drawings, wherein like reference numerals designate identical or corresponding parts throughout the several views, examples and exemplary embodiments of this disclosure are described.

Figure 5:
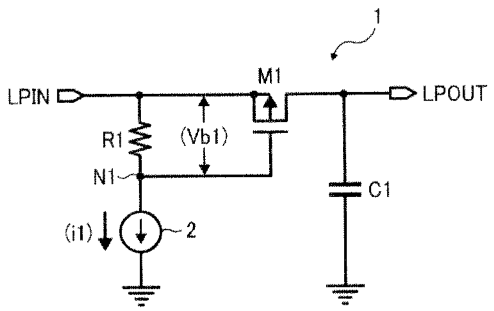
FIG. 5 is a circuit diagram schematically illustrating a low-pass filter according to one embodiment of this patent specification.

FIG. 5 is a circuit diagram schematically illustrating a low-pass filter 1 according to one embodiment of this patent specification.

As shown in FIG. 5, the low-pass filter 1 includes a first, p-channel metal-oxide semiconductor (PMOS) transistor M1, a capacitor C1, a first resistor R1 having a given resistance r1, and a first current source 2, which together form a filtering circuit that eliminates frequencies higher than a given cutoff frequency from a signal input to an input terminal LPIN to output a filtered signal to an output terminal LPOUT.

In the low-pass filter 1, the first resistor R1 and the first current source 2 are connected in series between the input terminal LPIN and ground, forming a first node N1 therebetween. The first transistor M1 has its source terminal connected to the input terminal LPIN, its drain terminal connected to the output terminal LPOUT, and its gate terminal connected to the node N1. The capacitor C1 is connected between the output terminal LOUT and ground.

During operation, the first current source 2 supplies a given first current i1 to the first resistor R1, which in turn generates a first voltage or potential drop Vb1 thereacross proportional to its resistance r1 and the supplied current i1. The first transistor M1 thus biased with the voltage Vb1 applied between its gate and source terminals exhibits an impedance corresponding to the gate bias voltage Vb1, which, together with a capacitance of the capacitor C1, determines the cutoff frequency with which the low-pass filter 1 performs filtering on an input signal.

The low-pass filter 1 is configured with sufficiently small values of the resistor R1 and the current source 2 so that the transistor bias voltage Vb1 determined by the product of r1 and i1 is smaller than a threshold voltage of the first transistor M1. That is, the first transistor M1 operates in a subthreshold region where it conducts an extremely small, subthreshold current substantially exponentially proportional to the applied bias voltage Vb1, which means an extremely high impedance across the first transistor M1.

In such a configuration, the low-pass filter 1 can operate with extremely low cutoff frequencies even where the capacitor C1 is of a relatively small value. For example, to obtain a cutoff frequency of 1 hertz (Hz) with the capacitor C1 having a capacitance of 100 picofarads (pF), the first transistor M1 is required to have an impedance of approximately 10 gigaohms (GΩ). Such a high impedance is obtained with a small bias voltage Vb1 applied to the transistor M1, established with reasonably small values of the resistor R1 and the current source 2, which allows accommodation of these electronic components in a single semiconductor substrate so that the entire low-pass filter circuit 1 may be integrated into a single integrated circuit.

Thus, the low-pass filter 1 according to this patent specification provides a simple, reliable filtering circuit, wherein the biased first transistor M1 exhibits a stable, high impedance to determine the cutoff frequency of the low-pass filter 1. Biasing the first transistor M1 with the gate bias voltage Vb1 generated by the first resistor R1 supplied with the first current source 2 enables precise setting of a desired cutoff frequency even with a small value of the capacitor C1, while allowing for simple and compact structure of the low-pass filter 1 which can be integrated into a semiconductor integrated circuit.

Figure 6:
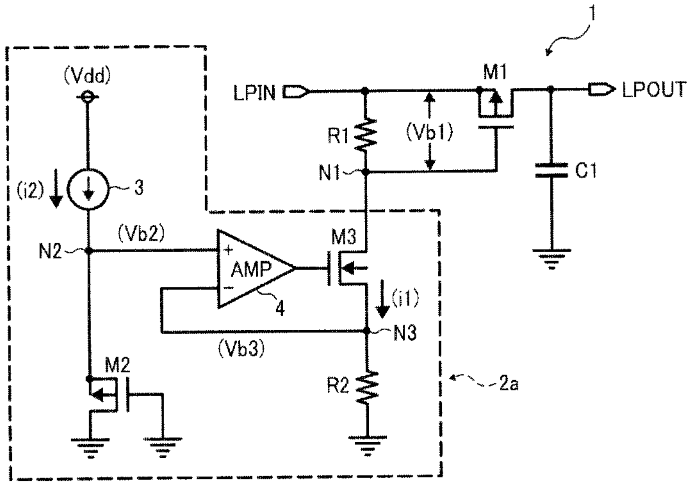
FIG. 6 is a circuit diagram schematically illustrating in detail one embodiment of a first current source included in the low-pass filter of FIG. 5.

FIG. 6 is a circuit diagram schematically illustrating in detail one embodiment of the first current source 2*a* included in the low-pass filter 1 according to this patent specification.

As shown in FIG. 6, the first current source 2*a* includes a second, constant current source 3, an operational amplifier 4, a second, PMOS transistor M2, a third, n-channel metal-oxide semiconductor (NMOS) transistor M3, and a second resistor R2 having a given resistance r2.

The second transistor M2 has an electrical conductivity and other physical properties substantially identical to those of the first transistor M1, and the second resistor R2 has physical properties substantially identical to those of the first resistor R1. As used herein, the term "physical properties" denotes characteristics and behaviors determined, for example, by the material and manufacturing process used to obtain the electronic component. Components identical in the physical properties operate in a substantially identical manner and can exhibit similar variations due to changes in environmental conditions, such as temperature, under which the low-pass filter 1 is operated.

In the first current source 2*a*, the constant current source 3 and the second transistor M2 are connected in series between a power supply input Vdd and ground, forming a second node N2 therebetween. The second transistor M2 has its source terminal connected to the current source 3, and its drain and gate terminals grounded. The third transistor M3 and the second resistor R2 are connected in series between the first node N1 and ground, forming a third node N3 therebetween. The operational amplifier 4 has a non-inverting input connected to the second node N2, an inverting input connected to the third node N3, and an output connected to a gate terminal of the third transistor M3.

During operation, the constant current source 3 supplies a second, constant current i2 to the source of the second transistor M2, which generates a second voltage Vb2 corresponding to the supplied current i2 at its source or node N2 for input to the non-inverting input of the operational amplifier 4. The second voltage Vb2 thus determined by the amount of the second current i2 acts as a gate bias voltage of the second transistor M2.

The third transistor M3 conducts a first current i1 for flowing through the first resistor R1 as well as the second resistor R2, the amount of which is regulated according to a control signal applied to the gate terminal of the transistor M3. The second resistor R2, thus supplied with the first current i1, generates a third voltage Vb3 proportional to its resistance r2 and the current i1 at the node N3 for input to the inverting input of the operational amplifier 4.

Comparing the inverting input voltage Vb3 against the non-inverting input voltage Vb2, the operational amplifier 4 outputs the control signal to control the operation of the transistor M3 so that the voltage Vb3 at the third node N3 is substantially equal to the voltage Vb2 at the second node N2. This results in the first current i1 flowing through the resistor R2 substantially proportional to the gate bias voltage Vb2 of the second transistor M2, as represented by the following Equation 1:

$$i1=Vb2/r2 \qquad \text{Eq. 1}$$

The first current i1 thus output by the first current source 2 flows through the first resistor R1 in the low-pass filter 1 to generate the first voltage Vb1, determined by the product of the resistance r1 and the current i1 across the first resistor R1. Substituting Eq. 1 into Vb1=r1*i1, the gate bias voltage Vb1 applied to the first transistor M1 is given by the following Equation 2:

$$Vb1=Vb2*r1/r2 \qquad \text{Eq. 2}$$

As mentioned, the second transistor M2 has an electrical conductivity and other properties substantially identical to those of the first transistor M1. This means that variations in the gate bias voltage Vb2 of the second transistor M2 occurring, e.g., due to changes in temperature, are cancelled out by variations in the gate bias voltage Vb1 of the first transistor M1. The result is that the impedance of the first transistor M1 is substantially insensitive to process or environmental variations, leading to high stability of the cutoff frequency of the low-pass filter 1 supplied with the current source 2*a*.

Also as mentioned, the first and second resistors R1 and R2 have substantially identical physical properties. This means that the ratio of the first and second resistances r1 and r2, to which the gate bias voltage Vb1 of the first transistor M1 is proportional (see Eq. 2), remains substantially constant and does not affect the first voltage Vb1 regardless of process and environmental variations. Moreover, should there be variations in the constant current i2 due to process or environmental variations to affect the second voltage Vb2, the first voltage Vb1 may remain unaffected by variations in the second voltage Vb2 where the ratio of the first and second resistances r1 and r2 is smaller than one.

Thus, the low-pass filter 1 according to this patent specification can operate with a stable cutoff frequency, wherein the current source 2*a*, formed of the second transistor M2 substantially identical in properties to the first transistor M1, and the second resistor R2 substantially identical in properties to the first resistor R1, supplies the low-pass filter 1 without causing variations in the impedance of the first transistor M1 even where there are variations in the electronic components resulting from variations in process or environmental conditions.

Figure 7:
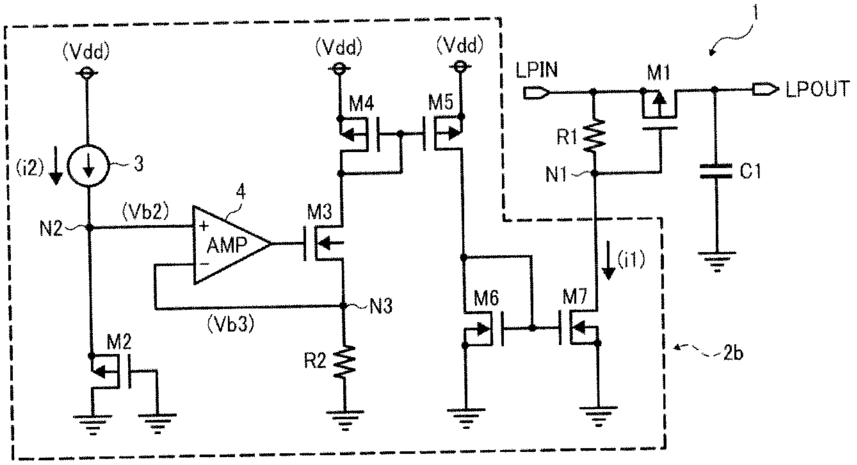
FIG. 7 is a circuit diagram schematically illustrating another embodiment of the first current source included in the low-pass filter of FIG. 5.

FIG. 7 is a circuit diagram schematically illustrating another embodiment of the first current source 2*b* included in the low-pass filter 1 according to this patent specification.

As shown in FIG. 7, the present embodiment is similar to that depicted in FIG. 6, except that the first current source 2*b* includes a pair of fourth and fifth, PMOS transistors M4 and M5 forming a first current mirror, and a pair of sixth and seventh, NMOS transistors M6 and M7 forming a second current mirror, in addition to the second current source 3, the operational amplifier 4, the second transistor M2, the third transistor M3, and the second resistor R2.

In the first current source 2*b*, the components included in the current source 2*a* are connected in a manner similar to that depicted with reference to FIG. 6, except that the third transistor M3 has its drain terminal connected to the drain terminal of the fourth transistor M4 instead of the first node N1. The fourth and fifth transistors M4 and M5 have their source terminals connected together to the power supply input Vdd, and their gate terminals connected together to the drain terminal of the fourth transistor M4. The sixth and seventh transistors M6 and M7 have their source terminals connected together to ground, and their gate terminals connected together to the drain terminal of the sixth transistor M6. The drain terminal of the fifth transistor M5 is connected to the drain terminal of the sixth transistor M6. The drain terminal of the seventh transistor M7 is connected to the first node N1.

During operation, a current flowing through the third transistor M3 is replicated through the first current mirror and then through the second current mirror to generate a first current i1 flowing through the seventh transistor M7, which is supplied to the first resistor R1 to generate the gate bias voltage Vb1 applied to the first transistor M1 in the low-pass filter 1.

As is the case with the embodiment of FIG. 6, the first current source 2*b*, formed of the second transistor M2 substantially identical in properties to the first transistor M1, and the second resistor R2 substantially identical in properties to the first resistor R1, supplies the low-pass filter 1 without causing variations in the impedance of the first transistor M1.

Moreover, provision of the first and second current mirrors inserted between the third transistor M3 and the output N1 of the first current source 2*b* results in the low-pass filter 1 having only one NMOS transistor M7 interposed between the resistor R1 and ground. Compared to the configuration of FIG. 6, where there is one NMOS transistor M3 and one resistor R2 between the resistor R1 and ground, this arrangement enables the low-pass filter 1 to operate with an extremely low input voltage input to the input terminal LPIN, allowing low-voltage application of the low-pass filter 1 using the first current source 2*b*.

Figure 8:
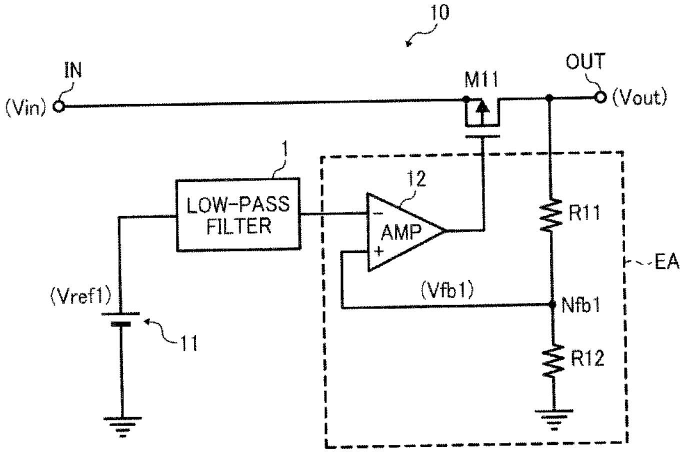
FIG. 8 is a circuit diagram schematically illustrating one embodiment of a constant voltage circuit incorporating the low-pass filter of FIG. 5.

FIG. 8 is a circuit diagram schematically illustrating one embodiment of a constant voltage circuit 10 incorporating the low-pass filter 1 according to this patent specification.

As shown in FIG. 8, the constant voltage circuit 10 is configured as a series regulator that converts an input voltage Vin input to an input terminal IN to generate a given constant voltage Vout for output to an output terminal OUT, including, in addition to the low-pass filter 1, an output, PMOS transistor M11, a reference voltage generator 11, and an error amplification circuit EA formed of a pair of voltage divider resistors R11 and R12 having given resistances r11 and r12, respectively, and an error amplifier 12. All the components of the voltage regulator 10, or in certain applications, all except for the output transistor M11, may be integrally formed on a single semiconductor substrate for integration into a semiconductor integrated circuit.

In the constant voltage regulator 10, the output transistor M11 is connected between the input and output terminals IN and OUT. The voltage divider resistors R11 and R12 are connected in series between the output terminal OUT and ground, forming a feedback node Nfb1 therebetween. The error amplifier 12 has an inverting input connected to the reference voltage generator 11 through the low-pass filter 1, a non-inverting input connected to the node Nfb1, and an output connected to a gate terminal of the output transistor M11.

The low-pass filter 1, thus inserted between the reference voltage generator 11 and the error amplifier 12, has its input terminal LPIN connected to the output of the reference voltage generator 11 and its output terminal LOUT connected to the inverting input of the error amplifier 12.

During operation, the voltage divider resistors R11 and R12 generate a feedback voltage Vfb1 at the feedback node Nfb1 by dividing the output voltage Vout. The reference voltage generator 11 generates a given reference voltage Vref1 for input to the low-pass filter 1, which filters out high-frequency noise on the incoming signal Vref1 for output to the error amplifier 12.

Upon receiving the filtered reference voltage Vref1 at the inverting input and the feedback voltage Vfb1 at the non-inverting input, the error amplifier 12 amplifies a difference between the input voltages Vref1 and Vfb1 to generate a control signal for application to the gate of the output transistor M11, which controls operation of the transistor M11 so that the feedback voltage Vfb1 is substantially equal to the reference voltage Vref1. This results in the transistor M11 regulating current flow from the input terminal IN to the output terminal OUT to maintain the output voltage Vout at a given constant level.

Given the feedback voltage Vfb1 is maintained substantially equal to the reference voltage Vref1, the output voltage Vout is represented by the following Equation 3:

$$Vout = Vref1*(r11+r12)/r12 \quad \text{Eq. 3}$$

In such a configuration, any noise contained in the reference voltage Vref1 at the input to the error amplifier 12 is multiplied by a factor of (r11+r12)/r12 for superimposition on the resulting output signal Vout, as indicated by Equation 3. Providing the low-pass filter 1 between the reference voltage generator output Vref1 and the error amplifier 12 input can effectively reduce noise in the output voltage Vout of the constant voltage regulator 10, wherein filtering is performed on the reference voltage Vref1 input to the input terminal LPIN prior to amplification through the error amplifier 12.

Figure 9:
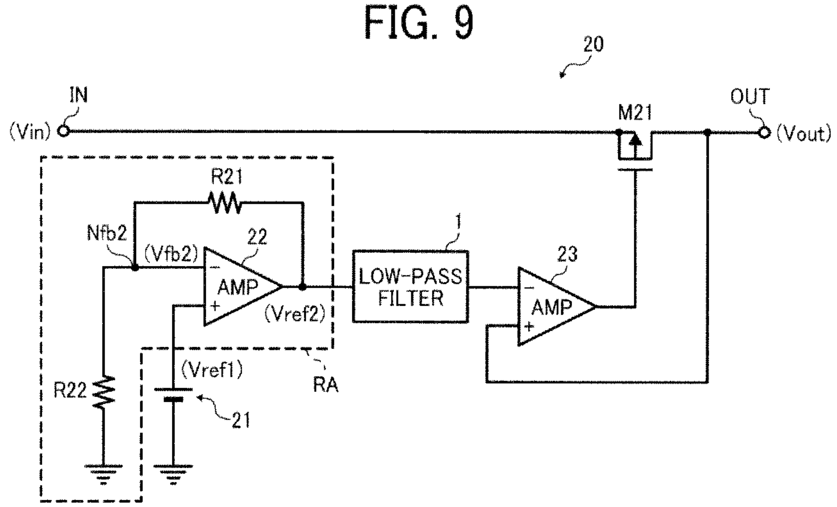
FIG. 9 is a circuit diagram schematically illustrating another embodiment of the constant voltage circuit incorporating the low-pass filter of FIG. 5.

FIG. 9 is a circuit diagram schematically illustrating another embodiment of a constant voltage circuit 20 incorporating the low-pass filter 1 according to this patent specification.

As shown in FIG. 9, the constant voltage circuit 20 is a series regulator that converts an input voltage Vin input to an input terminal IN to generate a given constant voltage Vout for output to an output terminal OUT, including, in addition to the low-pass filter 1, an output, PMOS transistor M21, a reference voltage generator 21, a controller or buffer amplifier 23, and a reference voltage amplification circuit RA formed of a pair of resistors R21 and R22, and an operational amplifier 22. All the components of the voltage regulator 20, or in certain applications, all except for the output transistor M21, may be integrally formed on a single semiconductor substrate for integration into a semiconductor integrated circuit.

In the constant voltage regulator 20, the output transistor M21 is connected between the input and output terminals IN and OUT. The resistors R21 and R22 are connected in series between an output terminal of the operational amplifier 22 and ground, forming a feedback node Nfb2 therebetween. The operational amplifier 22 has an inverting input connected to the node Nfb2, and a non-inverting input connected to the reference voltage generator 21. The output of the operational amplifier 22 is connected to the buffer amplifier 23 through the low-pass filter 1. The buffer amplifier 23 has an inverting input connected to the output of the operational amplifier 22 through the low-pass filter 1, a non-inverting input connected to the output terminal OUT, and an output connected to a gate terminal of the output transistor M21.

The low-pass filter 1, thus inserted between the reference amplification circuit RA and the buffer amplifier 23, has its input terminal LPIN connected to the output of the operational amplifier 22 and its output terminal LOUT connected to the inverting input of the buffer amplifier 23.

During operation, the resistors R21 and R22 generate a feedback voltage Vfb2 at the feedback node Nfb2 for input to the operational amplifier 22 by dividing the voltage at the output of the operational amplifier 22. The reference voltage generator 21 generates a given reference voltage Vref1 for input to the operational amplifier 22. Upon receiving the feedback voltage Vfb2 at the inverting input and the reference voltage Vref1 at the non-inverting input, the operational amplifier 22 amplifies a difference between the input voltages Vfb2 and Vref1 to generate an amplified reference voltage Vref2. The amplified reference voltage Vref2 is input to the low-pass filter 1, which filters out high-frequency noise on the incoming signal for output to the buffer amplifier 23.

Upon receiving the filtered reference voltage Vref2 at the inverting input and the output voltage Vout at the non-inverting input, the buffer amplifier 23 amplifies a difference between the input voltages to generate a control signal for application to the gate of the output transistor M21, which controls operation of the transistor M21 so that the output voltage Vout is substantially equal to the amplified reference voltage. This results in the transistor M21 regulating current flow from the input terminal IN to the output terminal OUT to maintain the output voltage Vout at a given constant level.

Given the output voltage Vout is maintained substantially equal to the amplified reference voltage Vref2 output by the reference voltage amplifier RA, the output voltage Vout is represented by the following Equation 4:

$$Vout = Vref1*(r21+r22)/r22 \quad \text{Eq. 4}$$

In such a configuration, providing the low-pass filter 1 between the reference voltage amplifier RA output and the buffer amplifier 23 input can effectively reduce noise in the output voltage Vout of the constant voltage regulator 20, where filtering is performed on the relatively large voltage input to the input terminal LPIN subsequent to amplification through the reference amplification circuit RA.

Thus, the constant voltage circuit according to this patent specification can provide reliable voltage regulation with extremely low noise contained in the output signal owing to the low-pass filter 1 effectively filtering out high-frequency noise from the reference voltage based on which the output voltage is regulated. As described in the embodiments above, the constant voltage circuit may be configured with the low-pass filter 1 filtering the reference voltage either downstream or upstream of voltage amplification, and either configuration can be selectively used according to specific applications of the constant voltage regulator.

Preferably, the constant voltage circuit according to this patent specification has a startup circuit provided to the low-pass filter 1 to temporarily reduce the impedance of the first transistor M1 to enable the capacitor C1 to swiftly charge up during startup. Such a fast startup capability can reduce the overall time required for the constant voltage circuit to initiate voltage regulation, compared to the embodiments depicted above with reference to FIGS. 8 and 9, wherein the low-pass filter 1 takes time to charge up the capacitor C1 after power on (e.g., approximately 1 second for a cutoff frequency of 1 Hz), which translates into a corresponding delay for the output voltage Vout to reach the constant level.

Figure 10:
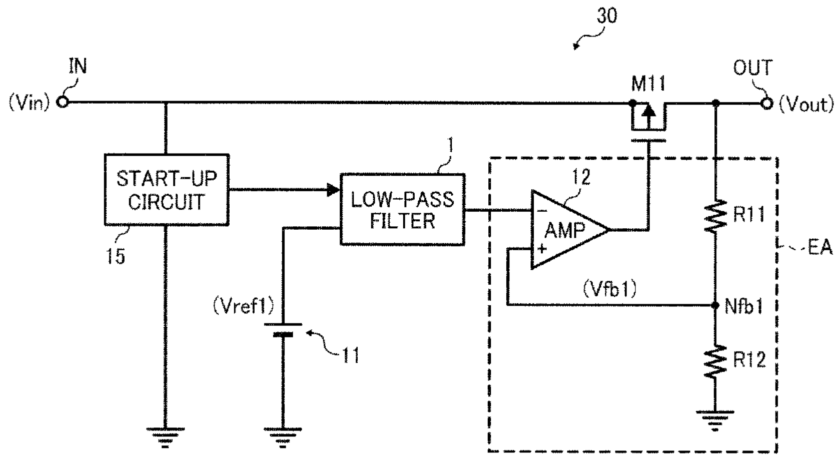
FIG. 10 is a circuit diagram schematically illustrating a constant voltage regulator with a startup circuit provided to the low-pass filter according to this patent specification.

FIG. 10 is a circuit diagram schematically illustrating a constant voltage regulator 30 with a startup circuit 15 provided to the low-pass filter 1 according to this patent specification.

As shown in FIG. 10, the constant voltage regulator 30 is similar to that depicted in FIG. 8, including the low-pass filter 1, the output transistor M11, and the error amplification circuit EA formed of the reference voltage generator 11, the error amplifier 12, and the voltage divider resistors R11 and R12, except for the startup circuit 15 connected to the low-pass filter 1.

During operation, the startup circuit 15 supplies current to the first resistor R1 upon application of power to the input terminal IN, and stops the supply of current when a predetermined period of time has elapsed after power on. This results in the additional current temporarily flowing through the resistor R1 in addition to the first current i1 to increase the bias voltage Vb1 applied to the first transistor M1, so that the biased transistor M1 exhibits a reduced impedance to immediately charge up the capacitor C1, leading to a reduced startup time of the voltage regulator 30 employing the low-pass filter 1.

Although the embodiment above depicts the startup circuit 15 provided to the voltage regulator 10 of FIG. 8, a similar arrangement may be provided for the voltage regulator 20 of FIG. 9, of which a detailed description is omitted for brevity.

Figure 11:
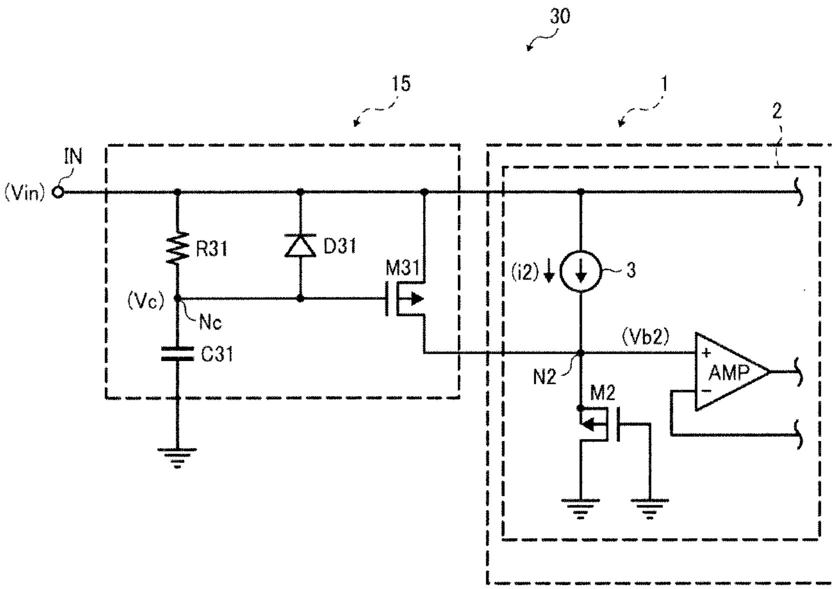
FIG. 11 is a circuit diagram schematically illustrating an example of the startup circuit provided to the low-pass filter according to this patent specification.

FIG. 11 is a circuit diagram schematically illustrating an example of the startup circuit 15 provided to the low-pass filter 1 in the constant voltage circuit according to this patent specification.

As shown in FIG. 11, the startup circuit 15 includes a PMOS transistor M31, a diode D31, a resistor R31, and a capacitor C31.

In the startup circuit 15, the resistor R31 and the capacitor C31 are connected in series between the input terminal IN and ground, forming a node Nc therebetween. The transistor M31 has its source terminal connected to the input terminal IN, its drain terminal connected to the second node N2 between the second current source 3 and the second transistor M2, and its gate terminal connected to the node Nc. The diode D31 has its cathode connected to the input terminal IN and its anode connected to the node Nc.

During operation, the capacitor C31 charges through the resistor R31 as the input voltage Vin is supplied to the input terminal IN, resulting in a voltage Vc at the node Nc gradually increasing from a ground voltage for application to the gate of the PMOS transistor M31. The transistor M31 remains conductive during a given period of time after power on where the gate voltage Vc gradually increases from ground to a threshold voltage of the transistor M31. The capacitor C31 discharges through the diode D31 when there is no voltage input to the input terminal IN.

Specifically, immediately after power on where the gate voltage Vc remains below the threshold voltage of the transistor M31, the transistor M31 conducts current flowing from the input terminal IN to the source of the second transistor M2, resulting in a high value of the second voltage Vb2 at the non-inverting of the operational amplifier 4. Since the gate bias voltage Vb1 of the first transistor M1 is proportional to the second voltage Vb2 (see, for example, Eq. 2), this causes the first transistor M1 to exhibit a relatively low impedance, enabling the capacitor C1 to swiftly charge up during startup of the low-pass filter 1.

Then, as a given period of time elapses after power on, the voltage Vc at the node Nc exceeds the threshold voltage of the transistor M31. This turns off the transistor M31 so as to stop the supply of current from the startup circuit 15 to the second transistor M2. With the second transistor M2 thus supplied only with the second current source 3, the low-pass filter 1 enters a normal state so that the first transistor M1 exhibits a sufficiently high impedance to obtain a desired cutoff frequency of the low-pass filter 1.

Thus, the startup circuit 15 included in the constant voltage circuit according to this patent specification can temporarily reduce the impedance of the first transistor M1 by increasing the amount of current flowing through the first resistor R1 for a given period of time after power on, so as to enable the capacitor C1 to immediately charge up during startup. Increasing the current flow across the first resistor R1 may be accomplished by providing an additional current, or by supplying a startup signal to cause the first current source 2 to temporarily increase the first current i1. In either case, by using the startup circuit 15 in conjunction with the low-pass filter 1, the constant voltage circuit according to this patent specification can swiftly enter operation without requiring excessive time for starting up the low-pass filter 1.

More preferably, the low-pass filter 1 according to this patent specification has at least the first transistor M1 formed in a silicon-on-insulator (SOI) structure, which enables the transistor M1 to operate with extremely high ON resistance without causing junction leak between the source and drain terminals.

Figure 12A:
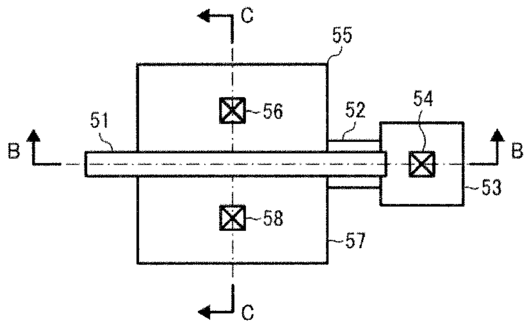
FIG. 12A is a plan view schematically illustrating an example of silicon-on-insulator structure for a p-channel metal-oxide semiconductor transistor used in the low-pass filter of FIG. 5.
Figure 12B:
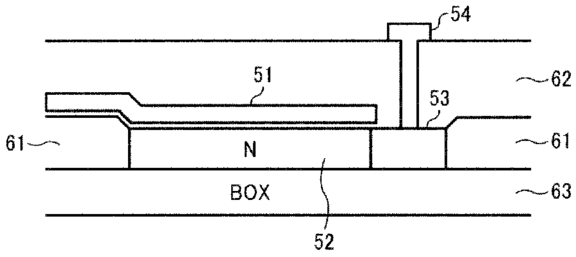
FIG. 12B is a cross-sectional view of the transistor structure taken along a line B-B of FIG. 12A.
Figure 12C:
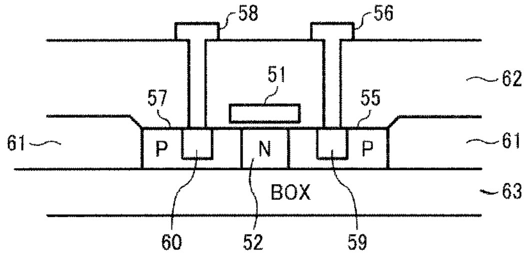
FIG. 12C is a cross-sectional view of the transistor structure taken along a line C-C of FIG. 12A.

FIG. 12A is a plan view schematically illustrating an example of SOI structure for the PMOS transistor M1, and FIGS. 12B and 12C are cross-sectional views of the transistor structure taken along lines B-B and C-C, respectively, of FIG. 12A.

As shown in FIGS. 12A through 12C, the transistor structure includes a gate electrode 51 formed above an n-type body 52 provided with a body contact 53 and electrode 54, a p-type drain region 55 with a drain contact 59 and electrode 56, and a p-type source region 57 with a source contact 60 and electrode 58, which together form a p-channel transistor built on a buried oxide or insulator layer 63 overlying a bulk substrate, not shown, and insulated with silicon dioxide 61 formed by local oxidation of silicon (LOCOS) on which lies an intermediate layer 62 separating one layer from another of the multilayered structure.

In the SOI structure, the drain region 55 and the source region 57 are formed on the insulator of buried oxide 63 so that there is no p-n junction or interface between each p-type region and the bulk substrate. This means there is substantially no risk of current leaking across the semiconductor junctions, allowing the PMOS transistor M1 to have an extremely high ON resistance ranging from several to several tens of gigaohms without junction leakage, as is required for operation in the low-pass filter 1 according to this patent specification.

The semiconductor structure depicted above may be fabricated using a known SOI technique, of which a detailed description is omitted for brevity. Although the embodiment above depicts only the SOI structure for the PMOS transistor M1, it is possible to construct the entire circuitry of the low-pass filter 1 on the SOI substrate.

To recapitulate, the low-pass filter 1 according to this patent specification includes the capacitor C1 connected between the output terminal LPOUT and ground, the first, PMOS transistor M1 with its source terminal connected to the input terminal LPIN and its drain terminal connected to the output terminal LOUT, the first resistor R1 connected between the source and gate terminals of the first transistor M1, and the first current source 2 connected between the gate terminal of the first transistor M1 and ground, wherein biasing the first transistor M1 with the first voltage generated across the first resistor R1 supplied with the first current source 2 establishes a stable impedance to enable reliable filtering with an extremely low cutoff frequency substantially insensitive to process and environmental variations, which can be formed on a single semiconductor substrate for integration into a semiconductor integrated circuit.

Numerous additional modifications and variations are possible in light of the above teachings. For example, although several embodiments disclosed herein describe the low-pass filter 1 incorporated into a constant voltage circuit being a series voltage regulator, the low-pass filter 1 according to this patent specification is applicable to various electronic systems including switching voltage regulators and other constant voltage circuits. It is therefore to be understood that within the scope of the appended claims, the disclosure of this patent specification may be practiced otherwise than as specifically described herein.

This patent specification is based on Japanese patent application No. 2009-165466 filed on Jul. 14, 2009 in the Japanese Patent Office, the entire contents of which are hereby incorporated by reference herein.

What is claimed is:

1. A low-pass filter that filters an input signal input to a filter input terminal to output a filtered output signal to a filter output terminal, the low-pass filter comprising:

a capacitor connected between the filter output terminal and ground;

a first field-effect transistor having a gate terminal, a first conduction terminal connected to the filter input terminal, and a second conduction terminal connected to the filter output terminal;

a first resistor connected between the gate and first conduction terminal of the first transistor; and a first current source connected to the first resistor to supply a first current to the first resistor, the first resistor generating a first voltage thereacross based on the supplied first current for electrically biasing the gate terminal of the first transistor, wherein the first current source includes:

a second current source to supply a second current;

a second field-effect transistor having a gate terminal, a first conduction terminal connected to the gate terminal thereof, and a second conduction terminal connected to the second current source, the second transistor generating a second voltage at the second conduction terminal thereof based on the second current supplied from the second current source;

a second resistor;

a third field-effect transistor having a gate terminal, a first conduction terminal connected to the first resistor, and a second conduction terminal connected to the second resistor, the third transistor conducting the first current between the first and second conduction terminals thereof for supply to the first resistor in response to a control signal applied to the gate terminal thereof, the second resistor generating a third voltage at the second conduction terminal of the third transistor conducting the first current; and an operational amplifier having a first input connected to the second conduction terminal of the second transistor, a second input connected to the second conduction terminal of the third transistor, and an output connected to the gate terminal of the third transistor to output the control signal to the gate terminal of the third transistor so as to maintain the third voltage substantially equal to the second voltage.

2. The low-pass filter according to claim 1, wherein the first current source further includes a current mirror connected between the first resistor and the first conduction terminal of the third transistor to generate a replicated first current for supply to the first resistor substantially proportional to the current flowing through the third transistor.

3. The low-pass filter according to claim 1, wherein the first and second transistors are substantially identical in conductivity type and have substantially identical physical properties.

4. The low-pass filter according to claim 1, wherein the first and second resistors have substantially identical physical properties.

5. A constant voltage circuit that converts an input voltage input to a voltage input terminal to generate a constant output voltage output to a voltage output terminal, the circuit comprising:

an output transistor connected between the voltage input and output terminals to control current flow therethrough according to a regulator control signal applied to a control terminal thereof;

a reference voltage generator to generate a reference voltage;

a regulator control circuit connected to the reference voltage generator and the voltage output terminal to generate the regulator control signal based on a comparison of the output voltage and the reference voltage for application to the control terminal of the output transistor; and a low-pass filter having a filter input terminal connected to the reference voltage generator and a filter output terminal connected to the control circuit to filter the reference voltage input to the filter input terminal to output a filtered reference voltage to the filter output terminal, the low-pass filter including:

a capacitor connected between the filter output terminal and ground;

a first field-effect transistor having a gate terminal, a first conduction terminal connected to the filter input terminal, and a second conduction terminal connected to the filter output terminal;

a first resistor connected between the gate and first conduction terminals of the first transistor; and a first current source connected to the first resistor to supply a first current to the first resistor, the first resistor generating a first voltage thereacross based on the supplied first current for electrically biasing the gate terminal of the first transistor, wherein the first current source includes:

a second current source to supply a second current;

a second field-effect transistor having a gate terminal, a first conduction terminal connected to the gate terminal thereof, and a second conduction terminal connected to the second current source, the second transistor generating a second voltage at the second conduction terminal thereof based on the second current supplied from the second current source;

a second resistor;

a third field-effect transistor having a gate terminal, a first conduction terminal connected to the first resistor, and a second conduction terminal connected to the second resistor, the third transistor conducting a first current between the first and second conduction terminals thereof for supply to the first resistor in response to a control signal applied to the gate terminal thereof, the second resistor generating a third voltage at the second conduction terminal of the third transistor conducting the first current; and an operational amplifier having a first input connected to the second conduction terminal of the second transistor, a second input connected to the second conduction terminal of the third transistor, and an output connected to the gate terminal of the third transistor to output the control signal to the gate terminal of the third transistor so as to maintain the third voltage substantially equal to the second voltage.

6. The constant voltage circuit according to claim 5, wherein the first current source further includes a current mirror connected between the first resistor and the first conduction terminal of the third transistor to generate a replicated first current for supply to the first resistor substantially proportional to the current flowing through the third transistor.

7. The constant voltage circuit according to claim 5, wherein the first and second transistors are substantially identical in conductivity type and have substantially identical physical properties.

8. The constant voltage circuit according to claim 5, wherein the first and second resistors have substantially identical physical properties.

9. The constant voltage circuit according to claim 5, further comprising a startup circuit connected to the first current source which supplies a current to the second conduction terminal of the second transistor to increase the first current through the first resistor for a given period of time after power on, to temporarily reduce impedance of the first transistor to immediately charge up the capacitor.

10. The constant voltage circuit according to claim 5, wherein the regulator control circuit includes:

a voltage divider connected to the voltage output terminal to generate a feedback voltage substantially proportional to the output voltage; and an error amplifier connected to the voltage divider and the reference voltage generator to amplify a difference between the reference voltage and the feedback voltage to generate the regulator control signal, the low-pass filter being inserted between the reference voltage generator and the error amplifier to filter the reference voltage output from the reference voltage generator prior to input to the error amplifier.

11. The constant voltage circuit according to claim 5, wherein the regulator control circuit includes:

a reference amplification circuit connected to the reference voltage generator to amplify the reference voltage; and a buffer amplifier connected to the voltage output terminal and the reference amplification circuit to amplify a difference between the amplified reference voltage and the output voltage to generate the regulator control signal, the low-pass filter being inserted between the reference amplification circuit and the buffer amplifier to filter the reference voltage output from the reference amplification circuit prior to input to the buffer amplifier.

12. A semiconductor integrated circuit wherein the constant voltage circuit according to claim 5 is integrated into a single integrated circuit.

13. The semiconductor integrated circuit according to claim 12, wherein at least the first transistor is fabricated on a semiconductor-on-insulator substrate.

* * * * *